US010325938B2

(12) United States Patent
Liu

(10) Patent No.: US 10,325,938 B2
(45) Date of Patent: Jun. 18, 2019

(54) TFT ARRAY SUBSTRATE, METHOD FOR MANUFACTURING THE SAME, AND DISPLAY DEVICE

(71) Applicant: BOE Technology Group Co., Ltd., Beijing (CN)

(72) Inventor: Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/531,154

(22) PCT Filed: Jun. 6, 2016

(86) PCT No.: PCT/CN2016/084947
§ 371 (c)(1),
(2) Date: May 26, 2017

(87) PCT Pub. No.: WO2017/166431
PCT Pub. Date: Oct. 5, 2017

(65) Prior Publication Data
US 2018/0197895 A1    Jul. 12, 2018

(30) Foreign Application Priority Data

Apr. 1, 2016 (CN) .......................... 2016 1 0202895

(51) Int. Cl.
*H01L 27/12* (2006.01)
*H01L 29/786* (2006.01)
(Continued)

(52) U.S. Cl.
CPC .... *H01L 27/1251* (2013.01); *H01L 21/02532* (2013.01); *H01L 21/02592* (2013.01);
(Continued)

(58) Field of Classification Search
CPC ............. H01L 27/1225; H01L 27/3262; H01L 27/0688; H01L 27/124; H01L 27/1255; H01L 29/7869; H01L 27/1251
(Continued)

(56) References Cited

U.S. PATENT DOCUMENTS 5,267,195 A    11/1993  Kodama
5,412,493 A    5/1995   Kunii et al.
(Continued)

FOREIGN PATENT DOCUMENTS

CN    1641878 A    7/2005
CN    1866540 A    11/2006
(Continued)

OTHER PUBLICATIONS

International Search Report and Written Opinion for International Application No. PCT/CN2016/084947, dated Jan. 5, 2017, 13 pages.
(Continued)

*Primary Examiner* — Jonathan Han
(74) *Attorney, Agent, or Firm* — Westman, Champlin & Koehler, P.A.

(57) ABSTRACT

A TFT array substrate, a method for manufacturing the same, and a display device including such TFT array substrate are disclosed. The TFT array substrate includes a base substrate (100); and two thin film transistors located on the base substrate. The two thin film transistors each includes an active layer (102, 107) having a source region and a drain region, the two active layers of the two thin film transistors are superposed with each other in a direction perpendicular to the base substrate. The drain region of one of the two active layers is electrically connected to the source region of the other one of the two active layers so that the two thin film transistors are connected in series.

18 Claims, 2 Drawing Sheets

(51) Int. Cl.
*H01L 21/265* (2006.01)
*H01L 21/02* (2006.01)
*H01L 21/266* (2006.01)
*H01L 29/66* (2006.01)
*G02F 1/1368* (2006.01)
*H01L 27/32* (2006.01)

(52) U.S. Cl.
CPC ...... *H01L 21/02667* (2013.01); *H01L 21/266* (2013.01); *H01L 21/26513* (2013.01); *H01L 27/1222* (2013.01); *H01L 27/1259* (2013.01); *H01L 27/1288* (2013.01); *H01L 29/6675* (2013.01); *H01L 29/78672* (2013.01); *G02F 1/1368* (2013.01); *H01L 27/1274* (2013.01); *H01L 27/3262* (2013.01)

(58) Field of Classification Search
USPC .............................. 257/59, 40, 72, E27.111
See application file for complete search history.

(56) References Cited

U.S. PATENT DOCUMENTS

| | | | |
|---|---|---|---|
| 7,626,205 | B2 | 12/2009 | Ishiguro |
| 2005/0179061 | A1 | 8/2005 | Jang et al. |
| 2005/0224876 | A1 | 10/2005 | Kuo |
| 2006/0008953 | A1 | 1/2006 | Kuo |
| 2006/0261336 | A1 | 11/2006 | Ohnuma et al. |
| 2009/0014799 | A1* | 1/2009 | Isobe ............... H01L 21/84 257/351 |
| 2015/0034945 | A1 | 2/2015 | Sakakura et al. |
| 2015/0311265 | A1* | 10/2015 | Matsueda ........... H01L 27/3218 257/40 |
| 2016/0020263 | A1 | 1/2016 | Xu et al. |
| 2017/0110527 | A1 | 4/2017 | Li |
| 2017/0141127 | A1 | 5/2017 | Shi et al. |

FOREIGN PATENT DOCUMENTS

| | | |
|---|---|---|
| CN | 101197380 A | 6/2008 |
| CN | 103367353 A | 10/2013 |
| CN | 104867942 A | 8/2015 |
| CN | 104882414 A | 9/2015 |
| CN | 105633101 A | 6/2016 |
| JP | H04-107859 A | 4/1992 |
| JP | H08-148693 A | 6/1996 |
| JP | 2001-66636 A | 3/2001 |
| JP | 2005-294851 A | 10/2005 |
| JP | 2009-38368 A | 2/2009 |
| WO | 2015/096375 A1 | 7/2015 |

OTHER PUBLICATIONS

English translation of International Search Report and Box V of the Written Opinion for International Application No. PCT/CN2016/084947, 7 pages.
First Office Action, including Search Report, for Chinese Patent Application No. 201610202895.6, dated Jan. 29, 2018, 24 pages.
Office Action for Korean Patent Application No. 10-2017-7015359, dated Sep. 18, 2018, 9 pages.
Office Action for Korean Patent Application No. 10-2017-7015359, dated Mar. 29, 2019, 10 pages.

* cited by examiner

TFT ARRAY SUBSTRATE, METHOD FOR MANUFACTURING THE SAME, AND DISPLAY DEVICE

CROSS-REFERENCE TO RELATED APPLICATION

This application is a Section 371 National Stage Application of International Application No. PCT/CN2016/084947, filed on Jun. 6, 2016, entitled "TFT ARRAY SUBSTRATE, METHOD FOR MANUFACTURING THE SAME, AND DISPLAY DEVICE", which claims priority to Chinese Application No. 201610202895.6, filed on Apr. 1, 2016, incorporated herein by reference in their entirety.

BACKGROUND

Technical Field

Embodiments of the present disclosure generally relate to a field of display technology, and more particularly, to a TFT array substrate capable of improving a resolution of a display panel, a method for manufacturing the same, and a display device comprising such a TFT array substrate.

Description of the Related Art

A TFT (Thin Film Transistor) array substrate is widely used in a display panel of a display device. In particular, a low-temperature polysilicon array substrate is gradually favored as an array substrate used in the display panel in recent years and is increasingly used in an organic electroluminescent displays or a liquid crystal display panel having high resolution and high picture quality, since it has advantages such as a high mobility and a high response speed. In the high resolution display panel, a number of small-sized thin film transistors are required, thus it demands higher requirements for process implementation, electrical performance and reliability of the thin film transistor array substrate. In particular, when a conventional low-temperature polysilicon thin film transistor array substrate is used in an organic electroluminescent diode display technology, it is generally necessary to provide a longer channel so as to drive the thin film transistor, thereby occupying a larger substrate area and restricting a high resolution design.

SUMMARY

According to an aspect of the present disclosure, there is provided a TFT array substrate, comprising: a base substrate; and two thin film transistors located on the base substrate, the two thin film transistors each comprising an active layer having a source region and a drain region, the two active layers of the two thin film transistors being superposed with each other in a direction perpendicular to the base substrate, wherein the drain region of one of the two active layers is electrically connected to the source region of the other one of the two active layers via a through hole so that the two thin film transistors are connected in series.

In an embodiment, the two active layers comprise a first active layer formed on the base substrate and a second active layer positioned above the first active layer, the two thin film transistors further comprise at least a first gate insulation layer covering the first active layer, a second gate insulation layer covering the first gate insulation layer and a gate, all of which are located between the first active layer and the second active layer, the gate being disposed between the first gate insulation layer and the second gate insulation layer for use as a common gate of the two thin film transistors, and the second active layer being disposed on the second gate insulation layer.

In an embodiment, the TFT array substrate is provided with the through hole extending through the first gate insulation layer and the second gate insulation layer so as to expose the drain region of the first active layer, and the second active layer comprises a connecting portion located in the through hole so as to electrically connect the drain region of the first active layer to the source region of the second active layer.

In an embodiment, one of the two thin film transistors comprises a first gate located on the base substrate, a first gate insulation layer covering the first gate, and a first active layer located on the first gate insulation layer, the other one of the two thin film transistors comprises a second active layer located above the first active layer, a second gate insulation layer covering the second active layer and a second gate located on the second gate insulation layer, and the source region of the second active layer is electrically connected to the drain region of the first active layer.

In an embodiment, the above-described TFT array substrate further comprises an interlayer insulation layer covering the one of the two thin film transistors, wherein the second active layer is located on the interlayer insulation layer.

In an embodiment, the TFT array substrate is provided with the through hole extending through the interlayer insulation layer so as to expose the drain region of the first active layer, and the second active layer comprises a connecting portion located in the through hole so as to electrically connect the drain region of the first active layer to the source region of the second active layer.

In an embodiment, the above-described TFT array substrate further comprises a source electrode layer electrically connected to the source region of the first active layer and a pixel electrode layer electrically connected to the drain region of the second active layer.

In an embodiment, the connecting portion comprises a portion formed of a same material as the second active layer and doped.

In an embodiment, the active layers each comprises a low-temperature polysilicon layer.

According to another aspect of the present disclosure, there is provided a method for manufacturing a TFT array substrate, comprising steps of:

providing a base substrate; and forming two thin film transistors on the base substrate, the two thin film transistors each comprising an active layer having a source region and a drain region, the two active layers of the two thin film transistors being superposed with each other in a direction perpendicular to the base substrate, wherein the drain region of one of the two active layers is electrically connected to the source region of the other one of the two active layers via a through hole so that the two thin film transistors are connected in series.

In an embodiment, the step of forming the two thin film transistors comprises steps of:

forming a first semiconductor material layer on the base substrate and patterning the first semiconductor material layer with a first mask to form a first active layer;

forming a first gate insulation layer covering the first active layer;

forming a gate material layer on the first gate insulation layer and patterning the gate material layer with a second mask to form a gate located above the first active layer;

forming a second gate insulation layer covering the gate and the first gate insulation layer;

forming the through hole extending through the second gate insulation layer and the first gate insulation layer by using a third mask to expose the drain region of the first active layer; and forming a second semiconductor material layer on the second gate insulation layer and patterning the second semiconductor material layer with the first mask to form a second active layer, a portion of the second active layer being located in the through hole to form a connecting portion for electrically connecting the drain region of the first active layer to the source region of the second active layer.

In an embodiment, the step of forming the first semiconductor material layer and/or the step of forming the second semiconductor material layer comprises steps of: forming an amorphous silicon layer; and transforming the amorphous silicon layer into a polysilicon layer by a process of excimer laser crystallization, metal induced crystallization or solid phase crystallization.

In an embodiment, before the step of forming the first active layer, or after the step of forming the first active layer but before the step of forming the first gate insulation layer, the method further comprises a step of: forming an electrically conductive material layer on the base substrate and patterning the electrically conductive material layer by using a fourth mask to obtain a source electrode layer, wherein a portion of the first active layer is superposed with a portion of the source electrode layer.

In an embodiment, the method further comprises steps of:

after forming the gate but before forming the second gate insulation layer, implementing a first ion implantation process by using the gate as a shielding mask, so as to implement an ion doping process to the source region and the drain region of the first active layer; and after forming the second active layer, implementing a second ion implantation process by using the second mask as another shielding mask, so as to implement an ion doping process to the source region and the drain region of the second active layer.

In an embodiment, the method further comprises a step of: after forming the second active layer, implementing an ion implantation process by using the second mask as a shielding mask, so as to implement an ion doping process to the source regions and the drain regions of the first active layer and the second active layer.

In an embodiment, the connecting portion of the second active layer located in the through hole is also doped when the ion doping process is implemented to the second active layer.

In an embodiment, the method further comprises steps of:

forming a planarization layer over the base substrate to cover the second active layer and the second gate insulation layer by using a fifth mask; and forming a pixel electrode layer on the planarization layer by using a sixth mask, the pixel electrode layer being electrically connected to the drain region of the second active layer.

According to still another aspect of the present disclosure, there is provided a display device, comprising the TFT array substrate according to any one of the above-described embodiments, or the TFT array substrate manufactured by the method according to any one of the above-described embodiments.

BRIEF DESCRIPTION OF THE DRAWINGS

The features and advantages of the present disclosure will become more apparent from the following description with reference to the accompanying drawings, and the drawings are schematic and are not to be construed as limiting the present disclosure. In the drawings.

DETAILED DESCRIPTION OF PREFERRED EMBODIMENTS

Figure 1:
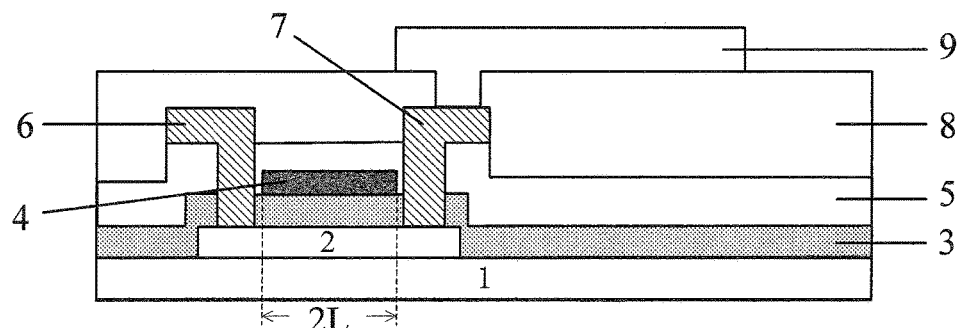
FIG. 1 is a cross sectional view showing a structure of a portion of a TFT array substrate.

Embodiments of the present disclosure will now be described in detail with reference to the accompanying drawings. In the present specification, the same or similar parts are indicated by the same or similar reference numerals. The following description of the various embodiments of the present disclosure with reference to the accompanying drawings is intended to illustrate a general concept of the present disclosure, but should not be construed as limiting the present disclosure.

Furthermore, in the following detailed description, for purposes of explanation, numerous specific details are set forth in order to provide a thorough understanding of the embodiments of the present disclosure. However, it will be apparent that one or more embodiments may also be carried out without these specific details. In other instances, well known structures and devices are schematically illustrated to simplify the drawings.

FIG. 1 is a schematic view for showing a structure of a low-temperature polysilicon thin film transistor array substrate including a substrate 1, an active layer 2, a gate insulation layer 3, a gate layer 4, an intermediate insulation layer 5, a via hole penetrating through the intermediate insulation layer and the gate insulation layer, source and drain electrode layers 6, 7, a planarization layer 8 and a pixel electrode layer 9. In order to achieve such array substrate, it requires at least six masks for forming the active layer, the gate layer, the via hole, the source and drain electrode layers, the planarization layer and the pixel electrode layer. In a preparation process of a high resolution array substrate, channel length becomes is a key factor, especially for driving the thin film transistors of the organic electroluminescent diode display device, in which the channel length 2L may reach up to tens of microns, resulting in occupying a larger area and further adversely affecting implementation of high resolution.

According to a general inventive concept of the present disclosure, it provides a TFT array substrate, comprising two active layers superposed with each other in a direction perpendicular to a base substrate, and these two active layers are electrically connected to each other, for example, a drain region of one active layer is electrically connected to a source region of the other active layer, so as to form two thin film transistors superposed with each other in a vertical direction and connected in series. Thus, it is possible to reduce or save an area occupied by each thin film transistor on the substrate while maintaining a total effective channel length constant, thereby facilitating a high resolution design of a display panel, to meet the need for sensitivity to the channel length in an application of the thin film transistor in a high resolution display panel. In one example, the TFT array substrate is a low-temperature polysilicon array substrate.

Figure 2:
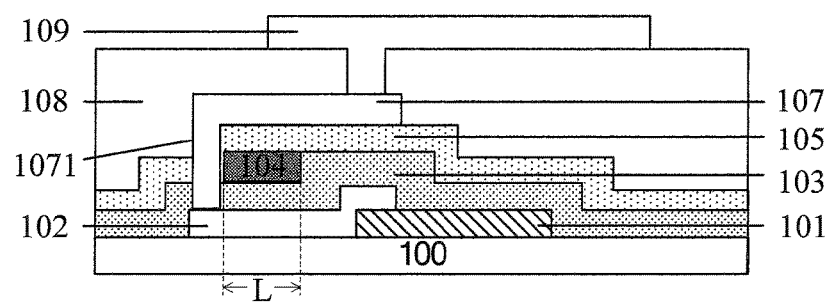
FIG. 2 is a cross sectional view showing a structure of a portion of a TFT array substrate according to an exemplary embodiment of the present disclosure.

FIG. 2 shows a structure of a portion of a TFT array substrate according to an exemplary embodiment of the present disclosure. As shown in FIG. 2, the TFT array substrate comprises a base substrate 100, a first active layer 102 formed on the base substrate 100, a first gate insulation layer 103 covering the first active layer 102, a gate 104 formed on the first gate insulation layer 103, a second gate insulation layer 105 at least covering the gate 104 and a second active layer 107 at least partially disposed on the second gate insulation layer 105. The first active layer 102, the first gate insulation layer 103 and the gate 104 form a portion of a first thin film transistor, while the gate 104, the second gate insulation layer 105 and the second active layer 107 form a portion of a second thin film transistor. Moreover, the second active layer 107 is electrically connected to the first active layer 102, so that the first thin film transistor is connected in series to the second thin film transistor.

In the embodiment, the first thin film transistor and the second thin film transistor superposed with each other share the gate 104, each of them has a channel length of L, and their total effective channel length is 2L, which is equal to the channel length of the conventional thin film transistor. However, on one hand, the area occupied on the substrate is reduced, thereby facilitating both an array substrate and a display panel having a high resolution; on the other hand, these two thin-film transistors connected in series can effectively reduce off-state leakage current and increase stability of the thin film transistors.

In an example, the drain region of one of these two active layers 102, 107 is electrically connected to the source region of the other of these two active layers, so as to achieve the series connection of the two thin film transistors. For example, in FIG. 2, a source electrode layer 101 is formed on the base substrate 100, and the source region of the first active layer 102 partially covers or makes contact with the source electrode layer 101, so as to realize the electrical connection of the source region of the first active layer 102 to the source electrode layer 101. Moreover, the drain region of the first active layer 102 is electrically connected to the source region of the second active layer 107, and the drain region of the second active layer 107 may be electrically connected to a pixel electrode layer 109. As shown in FIG. 2, the pixel electrode layer 109 may be disposed on a planarization layer 108 covering the second active layer 107 and the second gate insulation layer 105.

In one example, the TFT array substrate is provided with a through hole 106 extending through the first gate insulation layer 103 and the second gate insulation layer 105 so as to expose the drain region of the first active layer 102 (see FIG. 4c), and the second active layer 107 may comprise a connecting portion 1071 located in the through hole 106 so as to electrically connect the drain region of the first active layer 102 to the source region of the second active layer 107. In an example, the connecting portion 1071 may be formed of the same material as the second active layer 107, and alternatively, the connecting portion 1071 is doped to increase carrier concentration therein, and reduce on-resistance between the active layers in an on state.

Figure 3:
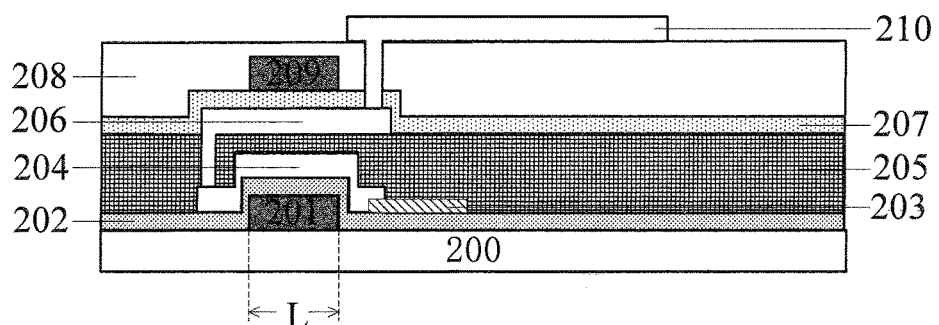
FIG. 3 is a cross sectional view showing a structure of a portion of a TFT array substrate according to another exemplary embodiment of the present disclosure.

FIG. 3 shows a structure of a portion of a TFT array substrate according to another exemplary embodiment of the present disclosure. As shown in FIG. 3, the TFT array substrate comprises a base substrate 200, a first gate 201 formed on the base substrate 200, a first gate insulation layer 202 covering the first gate 201, a first active layer 204 disposed on the first gate insulation layer 202, an interlayer insulation layer 205 covering the first active layer 204, a second active layer 206 formed on the interlayer insulation layer 205, a second gate insulation layer 207 covering the second active layer 206 and a second gate 209 disposed on the second gate insulation layer 207. The first gate 201, the first gate insulation layer 202 and the first active layer 204 form a portion of a first thin film transistor, while the second active layer 206, the second gate insulation layer 207 and the second gate 209 form a portion of a second thin film transistor. Moreover, the second active layer 206 is electrically connected to the first active layer 204, so that the first thin film transistor is connected in series to the second thin film transistor.

In the embodiment, the first thin film transistor and the second thin film transistor superposed with each other each has a channel length of L, and their total effective channel length is 2L, which is equal to the channel length of the conventional thin film transistor. However, on the one hand, the area occupied on the substrate is reduced, thereby facilitating an array substrate and a display panel to be of a high resolution; on the other hand, these two thin-film transistors connected in series can effectively reduce off-state leakage current and increase stability of the thin film transistors.

In an example, the drain region of one of these two active layers 204, 206 is electrically connected to the source region of the other one of these two active layers, so as to achieve the series connection of the two thin film transistors. For example, in FIG. 3, a source electrode layer 203 is formed on the first gate insulation layer 202, and the source region of the first active layer 204 is partially superposed or made contact with the source electrode layer 203, so as to realize the electrical connection of the source region of the first active layer 204 to the source electrode layer 203. Moreover, the drain region of the first active layer 204 is electrically connected to the source region of the second active layer 206, and the drain region of the second active layer 206 may be electrically connected to a pixel electrode layer 210. As shown in FIG. 3, the pixel electrode layer 210 may be disposed on a planarization layer 208 covering the second gate 209 and the second gate insulation layer 207.

In one example, the TFT array substrate is provided with a through hole extending through the interlayer insulation layer 205 so as to expose the drain region of the first active layer 204, and the second active layer 206 may comprise a connecting portion located in the through hole 106 so as to electrically connect the drain region of the first active layer 204 to the source region of the second active layer 206, for example, a vertical portion extending from the source region of the second active layer 206 to the drain region of the first active layer 204 as shown in the figure. In an example, the connecting portion may be formed of the same material as the second active layer 206, and alternatively, the connecting portion is doped to increase carrier concentration therein, and reduce on-resistance between the active layers in an on state.

According to another aspect, an embodiment of the present disclosure also provides a method for manufacturing a TFT array substrate, comprising steps of: providing a base substrate; and forming two thin film transistors on the base substrate, the thin film transistors each comprising an active layer having a source region and a drain region, the two active layers of the two thin film transistors being superposed with each other in a direction perpendicular to the base substrate, wherein the drain region of one of the two active layers is electrically connected to the source region of the other of the two active layers so that the two thin film transistors are connected in series.

Next, a method for manufacturing a TFT array substrate according to an exemplary embodiment of the present disclosure will be described in detail by way of example with reference to FIGS. 4a to 4d.

Firstly, a base substrate 100 is provided. The base substrate may be a transparent substrate, such as a glass substrate or the like, which is cleaned in advance, and a buffer layer formed of silicon oxide, silicon nitride, or a stacked combination of both may be applied on the base substrate, to prevent adversely affecting operating characteristics of the thin film transistor due to the diffusion of metal ion impurities in the transparent substrate into the active layer.

Figure 4A:
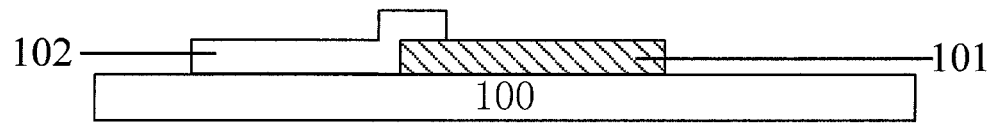
FIGS. 4a-4d are schematic views showing steps of a method for manufacturing a TFT array substrate according to an exemplary embodiment of the present disclosure.

As shown in FIG. 4a, a first semiconductor material layer is formed on the base substrate 100, and the first semiconductor material layer is patterned with a first mask to form a first active layer 102.

Figure 4B:
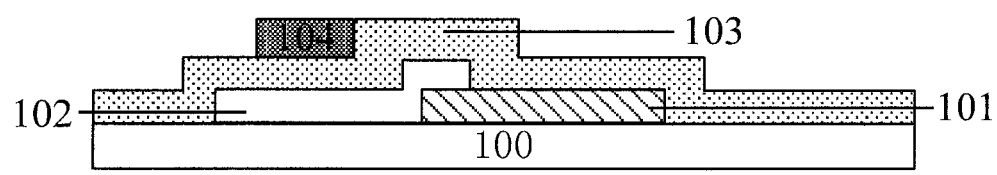

As shown in FIG. 4b, a first gate insulation layer 103 covering the first active layer 102 is formed, and a gate material layer is formed on the first gate insulation layer 103 and the gate material layer is patterned with a second mask to form a gate 104 located above the first active layer 102. The gate may have a structure of a single layer, two or more layers, and may be made of metal or metal alloy, such as molybdenum, aluminum, molybdenum tungsten or the like, and the thickness thereof may be in a range of 1000 Å to 5000 Å, alternatively in a range of 1500 Å to 4000 Å.

Figure 4C:
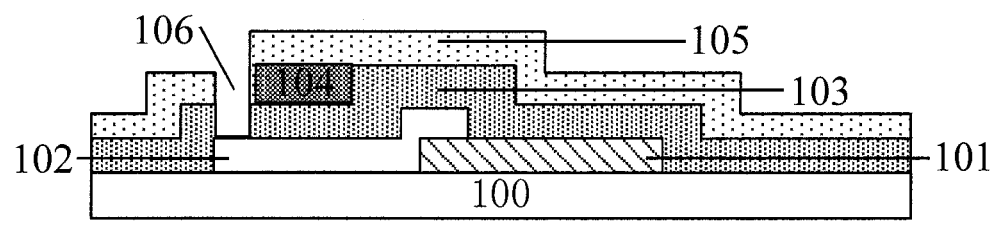

As shown in FIG. 4c, a second gate insulation layer 105 covering the gate 104 and the first gate insulation layer 103 is formed. In one example, the first and/or second gate insulation layer may be a single layer of silicon oxide, silicon nitride, or a stacked combination of both, and the present disclosure is not limited thereto. The first and/or second gate insulation layer may be deposited by PECVD, LPCVD, APCVD or ECR-CVD and the like, with a deposition thickness of 500 Å to 2000 Å. Further, a suitable thickness, for example 600 Å to 1500 Å, can be selected according to the specific design requirements.

Next, a through hole 106 extending through the second gate insulation layer 105 and the first gate insulation layer 103 is formed by using a third mask to expose the drain region of the first active layer 102.

Figure 4D:
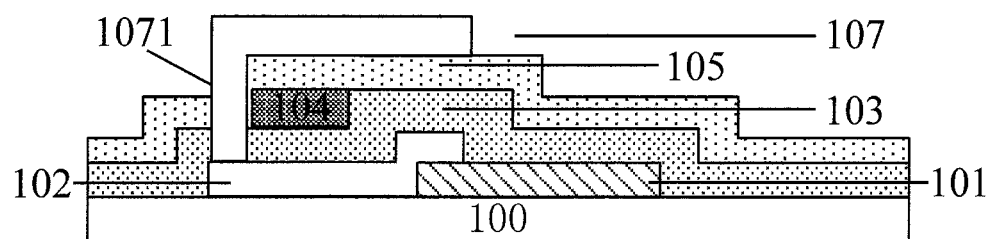

Then, as shown in FIG. 4d, a second semiconductor material layer is formed on the second gate insulation layer 105 and the second semiconductor material layer is patterned with the first mask as described above to form a second active layer 107. A portion of the second active layer is located in the through hole to form a connecting portion 1071 for electrically connecting the drain region of the first active layer 102 to the source region of the second active layer 107. In an example, the first and/or second active layer may be a polysilicon layer, which is transformed by an amorphous silicon layer by means of a process of excimer laser crystallization, metal induced crystallization or solid phase crystallization or the like, thereby forming a low-temperature polysilicon array substrate. It should be noted that depending on different crystallization methods, specific processes and structures of the thin film transistors will be different. For example, in the preparation process, it is possible to incorporate heat treatment dehydrogenation, deposition of induced metal, heat treatment crystallization, excimer laser illumination crystallization, doping of source and drain regions (P-type or N-type doping), activation of doped impurities and the like, without affecting implementation of the present disclosure. In such a situation, the present disclosure will also have a beneficial effect. Exemplarily, the thickness of the first and/or second active layer may be 100 Å to 3000 Å, specifically 500 Å to 1000 Å, and the forming method thereof may be PECVD, LPCVD or a sputtering method, and the deposition temperature is below 600° C.

In an embodiment, still as shown in FIG. 4a, before the step of forming the first active layer 102, or after the step of forming the first active layer 102 but before the step of forming the first gate insulation layer 103, the method further comprises a step of forming an electrically conductive material layer on the base substrate and patterning the electrically conductive material layer by using a fourth mask to obtain a source electrode layer 101, wherein a portion of the first active layer 102 is superposed with a portion of the source electrode layer 101.

Further, after forming the gate 104 but before forming the second gate insulation layer 105, a first ion implantation process may be implemented by using the gate 104 as a shielding mask, so as to implement an ion doping process to the source region and the drain region of the first active layer 102; after forming the second active layer 107, a second ion implantation process may be implemented by using the above-described second mask as another shielding mask, so as to implement an ion doping process to the source region and the drain region of the second active layer 107. Alternatively, after forming the second active layer 107, an ion implantation process may be implemented by using the above-described second mask as a shielding mask, so as to implement an ion doping process to the source regions and the drain regions of the first active layer 102 and the second active layer 107. It will be appreciated that the connecting portion of the second active layer located in the through hole may also be doped when the ion doping process is implemented to the second active layer, so as to increase carrier concentration therein, and reduce on-resistance between the active layers in an on state.

The ion implantation process may be an ion implantation method with a mass spectrometer, an ion cloud-type implantation method without a mass spectrometer, a plasma implantation method, a solid state diffusion implantation method or the like. For example, if a popular ion cloud-type implantation method is used, then a mixed gas including Boron such as $B_2H_6/H_2$ or Phosphorus such as $PH_3/H_2$ may be implanted according to the design requirements, and the ion implantation energy may be 10 to 200 keV, specifically 40 to 100 keV. The implantation dose may be in a range of $1\times10^{11} \sim 1\times10^{20}$ atoms/cm$^3$, specifically $1\times10^{14} \sim 1\times10^{18}$ atoms/cm$^3$.

As shown in FIG. 2, a planarization layer 108 covering the second active layer 107 and the second gate insulation layer 105 may be formed by using a fifth mask; and a pixel electrode layer 109 may be formed on the planarization layer 108 by using a sixth mask, wherein the pixel electrode layer 109 is electrically connected to the drain region of the second active layer 107. The planarization layer may be made of an organic material, specifically an organic photoresist material such as polyimide, acrylic or the like, with a thickness of 8000 Å to 20000 Å. The pixel electrode layer may be a structure of a single layer, two or more layers, and is composed of a transparent conductive material such as indium tin oxide, indium zinc oxide or the like, or metal, metal alloy, for example silver, silver alloy or the like, with a thickness of 1000 Å to 5000 Å, specifically 1500 Å to 4000 Å.

It can be seen that the method according to the embodiments of the present disclosure also uses six masks to manufacture the TFT array substrate, without increasing the number of masks compared to the conventional processes. Therefore, the method does not incorporate additional processes and increase process complexity in process realization, and the manufactured device has a better property.

Further, in an embodiment of the present disclosure, it is provided a display device, comprising the TFT array substrate according to any one of the above-described embodiments, or the TFT array substrate manufactured by the method according to any one of the above-described embodiments. Such a display device may be a liquid crystal panel, an electronic paper, an OLED panel, a mobile phone, a notebook computer, a tablet computer, a display, a digital photo frame, a navigator, an identification device, or any other products or components having a display function.

According to the embodiments of the present disclosure, there is provided a TFT array substrate, a method for manufacturing the same, and a display device. The TFT array substrate comprises two active layers superposed with each other in a direction perpendicular to the base substrate, and these two active layers are electrically connected to each other, for example, the drain region of one active layer is electrically connected to the source region of the other active layer, so as to form two thin film transistors superposed with each other in a vertical direction and connected in series. Thus, it is possible to reduce or save an area occupied by each thin film transistor on the substrate while maintaining a total effective channel length constant, thereby facilitating a high resolution design of a display panel, to meet the need for sensitivity to the channel length in an application of the thin film transistor in a high resolution display panel.

While various exemplary embodiments of the present disclosure have been shown and described, it will be understood by those skilled in the art that changes and modifications may be made to these embodiments without departing from the principle and spirit of the present disclosure, and the scope of the present disclosure is defined by the appended claims and their equivalents.

What is claimed is:

1. A TFT array substrate, comprising:
   a base substrate; and
   two thin film transistors located on the base substrate, the two thin film transistors each comprising an active layer having a source region and a drain region, the two active layers of the two thin film transistors being superposed with each other in a direction perpendicular to the base substrate, wherein the drain region of one of the two active layers is electrically connected to the source region of the other one of the two active layers via a through hole so that the two thin film transistors are connected in series,
   wherein the two active layers comprise a first active layer formed on the base substrate and a second active layer positioned above the first active layer, and the second active layer comprises a connecting portion for electrically connecting the drain region of the first active layer to the source region of the second active layer, and a portion of the second active layer forms the connecting portion,
   wherein the connecting portion comprises a portion formed of a same material as the second active layer and doped.

2. The TFT array substrate according to claim 1, wherein the two thin film transistors further comprise at least a first gate insulation layer covering the first active layer, a second gate insulation layer covering the first gate insulation layer and a gate, all of which are located between the first active layer and the second active layer, the gate being disposed between the first gate insulation layer and the second gate insulation layer for use as a common gate of the two thin film transistors, and the second active layer being disposed on the second gate insulation layer.

3. The TFT array substrate according to claim 2, wherein the TFT array substrate is provided with the through hole extending through the first gate insulation layer and the second gate insulation layer so as to expose the drain region of the first active layer, and the connecting portion is located in the through hole.

4. The TFT array substrate according to claim 2, further comprising a source electrode layer electrically connected to the source region of the first active layer and a pixel electrode layer electrically connected to the drain region of the second active layer.

5. The TFT array substrate according to claim 1, wherein one of the two thin film transistors comprises a first gate located on the base substrate, a first gate insulation layer covering the first gate, and a first active layer located on the first gate insulation layer,
   the other one of the two thin film transistors comprises a second active layer located above the first active layer, a second gate insulation layer covering the second active layer and a second gate located on the second gate insulation layer, and
   the source region of the second active layer is electrically connected to the drain region of the first active layer.

6. The TFT array substrate according to claim 5, further comprising an interlayer insulation layer covering the one of the two thin film transistors, wherein the second active layer is located on the interlayer insulation layer.

7. The TFT array substrate according to claim 6, wherein the TFT array substrate is provided with a through hole extending through the interlayer insulation layer so as to expose the drain region of the first active layer, and the connecting portion is located in the through hole.

8. The TFT array substrate according to claim 1, wherein the active layers each comprises a low-temperature polysilicon layer.

9. A display device, comprising the TFT array substrate according to claim 1.

10. A method for manufacturing a TFT array substrate, comprising steps of:
    providing a base substrate; and
    forming two thin film transistors on the base substrate, the two thin film transistors each comprising an active layer having a source region and a drain region, the two active layers of the two thin film transistors being superposed with each other in a direction perpendicular to the base substrate, wherein the drain region of one of the two active layers is electrically connected to the source region of the other one of the two active layers via a through hole so that the two thin film transistors are connected in series,
    wherein the two active layers comprise a first active layer formed on the base substrate and a second active layer positioned above the first active layer, and the second active layer comprises a connecting portion for electrically connecting the drain region of the first active layer to the source region of the second active layer, and a portion of the second active layer forms the connecting portion,
    wherein the connecting portion comprises a portion formed of a same material as the second active layer and dope.

11. The method according to claim 10, wherein the step of forming the two thin film transistors comprises steps of:
- forming a first semiconductor material layer on the base substrate and patterning the first semiconductor material layer with a first mask to form a first active layer;
- forming a first gate insulation layer covering the first active layer;
- forming a gate material layer on the first gate insulation layer and patterning the gate material layer with a second mask to form a gate located above the first active layer;
- forming a second gate insulation layer covering the gate and the first gate insulation layer;
- forming the through hole extending through the second gate insulation layer and the first gate insulation layer by using a third mask to expose the drain region of the first active layer; and
- forming a second semiconductor material layer on the second gate insulation layer and patterning the second semiconductor material layer with the first mask to form a second active layer, a portion of the second active layer being located in the through hole.

12. The method according to claim 11, wherein the step of forming the first semiconductor material layer and/or the step of forming the second semiconductor material layer comprises steps of:
- forming an amorphous silicon layer; and
- transforming the amorphous silicon layer into a polysilicon layer by a process of excimer laser crystallization, metal induced crystallization or solid phase crystallization.

13. The method according to claim 11, wherein before the step of forming the first active layer, or after the step of forming the first active layer but before the step of forming the first gate insulation layer, the method further comprises a step of:
- forming an electrically conductive material layer on the base substrate and patterning the electrically conductive material layer by using a fourth mask to obtain a source electrode layer, wherein a portion of the first active layer is superposed with a portion of the source electrode layer.

14. The method according to claim 11, further comprising steps of:
- after forming the gate but before forming the second gate insulation layer, implementing a first ion implantation process by using the gate as a shielding mask, so as to implement an ion doping process to the source region and the drain region of the first active layer; and
- after forming the second active layer, implementing a second ion implantation process by using the second mask as another shielding mask, so as to implement an ion doping process to the source region and the drain region of the second active layer.

15. The method according to claim 11, further comprising a step of:
- after forming the second active layer, implementing an ion implantation process by using the second mask as a shielding mask, so as to implement an ion doping process to the source regions and the drain regions of the first active layer and the second active layer.

16. The method according to claim 14, wherein the connecting portion of the second active layer located in the through hole is also doped when the ion doping process is implemented to the second active layer.

17. The method according to claim 11, further comprising steps of:
- forming a planarization layer over the base substrate to cover the second active layer and the second gate insulation layer by using a fifth mask; and
- forming a pixel electrode layer on the planarization layer by using a sixth mask, the pixel electrode layer being electrically connected to the drain region of the second active layer.

18. A display device, comprising the TFT array substrate manufactured by the method according to claim 10.

* * * * *